(12) United States Patent
Speer et al.

(10) Patent No.: US 12,477,950 B2
(45) Date of Patent: Nov. 18, 2025

(54) ELECTROMECHANICAL ACTUATOR HAVING CERAMIC INSULATION AND METHOD FOR PRODUCTION THEREOF

(71) Applicant: PI Ceramic GmbH, Lederhose (DE)

(72) Inventors: Kevin Speer, Mörsdorf (DE); Benjamin Dargatz, Jena (DE)

(73) Assignee: PI CERAMIC GMBH, Lederhose (DE)

( * ) Notice: Subject to any disclaimer, the term of this patent is extended or adjusted under 35 U.S.C. 154(b) by 939 days.

(21) Appl. No.: 17/606,327

(22) PCT Filed: Apr. 7, 2020

(86) PCT No.: PCT/EP2020/059887
§ 371 (c)(1),
(2) Date: Oct. 25, 2021

(87) PCT Pub. No.: WO2020/216612
PCT Pub. Date: Oct. 29, 2020

(65) Prior Publication Data
US 2022/0231217 A1 Jul. 21, 2022

(30) Foreign Application Priority Data
Apr. 26, 2019 (DE) .................. 10 2019 206 018.8

(51) Int. Cl.
*H01L 41/053* (2006.01)
*H10N 30/02* (2023.01)
(Continued)

(52) U.S. Cl.
CPC .......... *H10N 30/883* (2023.02); *H10N 30/02* (2023.02); *H10N 30/06* (2023.02); *H10N 30/20* (2023.02); *H10N 30/87* (2023.02)

(58) Field of Classification Search
CPC ........................ H10N 30/20; H01N 30/883
See application file for complete search history.

(56) References Cited

U.S. PATENT DOCUMENTS

| 5,817,250 A | 10/1998 | Mauczok et al. |
| 7,065,846 B2 | 6/2006 | Schreiner et al. |

(Continued)

FOREIGN PATENT DOCUMENTS

| CN | 1130897 A | 9/1996 |
| CN | 1802714 A | 7/2006 |

(Continued)

OTHER PUBLICATIONS

English Translation of JP 2006303349, Yukio (Year: 2006).*

(Continued)

*Primary Examiner* — Bryan P Gordon
(74) *Attorney, Agent, or Firm* — Buchanan Ingersoll & Rooney, PC

(57) ABSTRACT

The present disclosure relates to an electromechanical actuator, having a stack arrangement made of ceramic basis material having electromechanical properties and electrodes as well as a ceramic insulation for operation/use of the actuator in a humid environment. To ensure a long service life of the actuator with increased electromechanical expansion, an exemplary structure of the ceramic insulation has a smaller average grain size than the structure of the ceramic basis material. A method for the production of an actuator having ceramic insulation and a method for controlling such an actuator are also disclosed.

11 Claims, 1 Drawing Sheet

(51) Int. Cl.
  *H10N 30/06* (2023.01)
  *H10N 30/20* (2023.01)
  *H10N 30/87* (2023.01)
  *H10N 30/88* (2023.01)

(56) References Cited

U.S. PATENT DOCUMENTS

| | | | |
|---|---|---|---|
| 9,117,993 B2 | 8/2015 | Shimizu et al. | |
| 2002/0053860 A1* | 5/2002 | Mitarai | H10N 30/872 310/366 |
| 2003/0203805 A1 | 10/2003 | Maher et al. | |
| 2006/0232173 A1* | 10/2006 | Kobane | F02M 51/005 310/366 |
| 2007/0069610 A1* | 3/2007 | Ono | H10N 30/053 310/328 |
| 2010/0066212 A1* | 3/2010 | Denneler | H10N 30/872 29/25.35 |
| 2012/0262840 A1 | 10/2012 | Koizumi | |
| 2013/0221807 A1* | 8/2013 | Shimizu | H10N 30/875 310/366 |
| 2014/0091678 A1* | 4/2014 | Koizumi | B41J 2/1631 310/367 |
| 2014/0301013 A1 | 10/2014 | Kim | |
| 2017/0025222 A1 | 1/2017 | Park et al. | |
| 2018/0269375 A1 | 9/2018 | Schreiner et al. | |

FOREIGN PATENT DOCUMENTS

| | | |
|---|---|---|
| CN | 1830098 A | 9/2006 |
| CN | 101654366 A | 2/2010 |
| CN | 102751092 A | 10/2012 |
| CN | 104103424 A | 10/2014 |
| CN | 107924988 A | 4/2018 |
| DE | 10021919 C2 | 3/2002 |
| DE | 102011081279 A1 | 2/2013 |
| EP | 2079116 A2 | 7/2009 |
| EP | 2530756 A1 | 12/2012 |
| EP | 2667425 B1 | 12/2018 |
| JP | H0769722 A | 3/1995 |
| JP | 2005-203706 A | 7/2005 |
| JP | 2006303349 A | 11/2006 |
| JP | 2007-266468 A | 10/2007 |
| JP | 2009-091215 A | 4/2009 |
| JP | 2009-176971 A | 8/2009 |
| JP | 2012-064674 A | 3/2012 |
| JP | 2014-072511 A | 4/2014 |
| JP | 2015-142027 A | 8/2015 |
| JP | 2018-526823 A | 9/2018 |
| WO | 2017032868 A1 | 3/2017 |

OTHER PUBLICATIONS

International Search Report (PCT/ISA/210) with translation and Written Opinion (PCT/ISA/237) mailed on Jun. 26, 2020, by the European Patent Office as the International Searching Authority for International Application No. PCT/EP2020/059887.
Office Action (Pre-Appeal Re-Examination) issued on Feb. 6, 2024, by the Japanese Patent Office in corresponding Japanese Patent Application No. 2021-563317, and a machine English Translation of the Office Action. (13 pages).
Office Action (Notice of Grounds of Rejection) issued Jan. 24, 2023, by the Japan Patent Office in corresponding Japanese Patent Application No. 2021-563317 and an English translation of the Office Action. (16 pages).
Office Action (Notification Under Article 94(3) EPC) issued on Jun. 28, 2024, by the European Patent Office in corresponding European Patent Application No. 20 718 618.0, with a machine English translation. (8 pages).
Notification of the First Office Action issued on Feb. 12, 2025, by the Chinese Patent Office in corresponding Chinese Patent Application No. 202080044077.2, and an English Translation of the Office Action. (24 pages).
Office Action (Notice of Second Review Observations) issued on Jun. 6, 2025, by the Chinese Patent Office in corresponding Chinese Patent Application No. 202080044077.2, and a machine English Translation of the Office Action. (21 pages).
Office Action issued on Sep. 18, 2025, by the Chinese Patent Office in corresponding Chinese Patent Application No. 2020 80 044 077.2, and a machine English Translation of the Office Action. (20 pages).

* cited by examiner

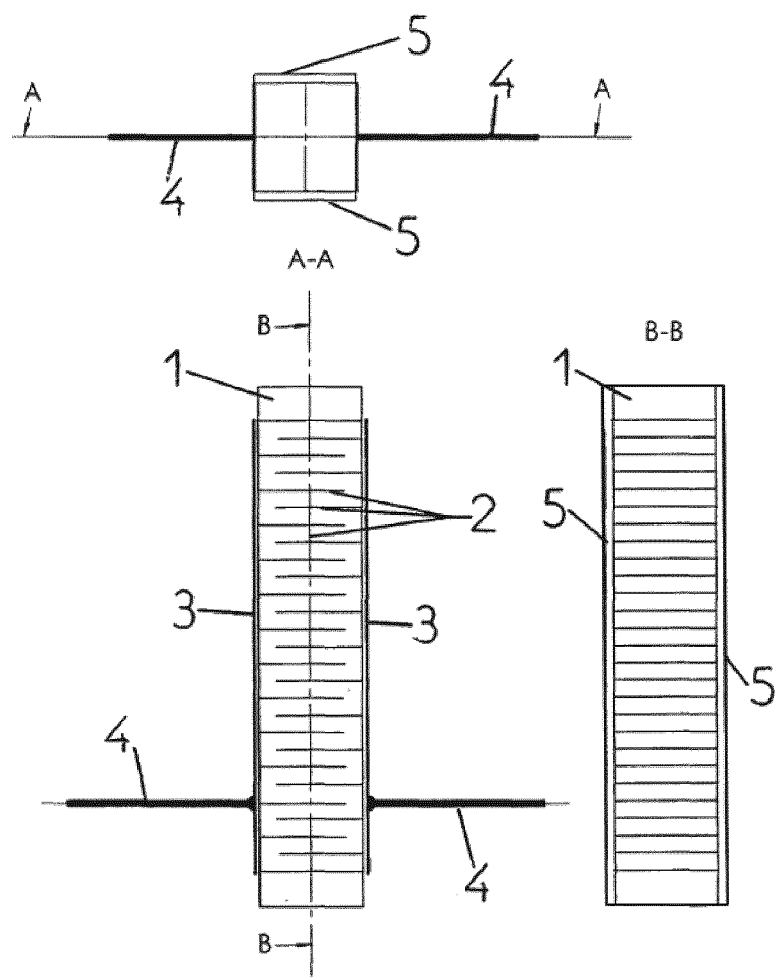

ELECTROMECHANICAL ACTUATOR HAVING CERAMIC INSULATION AND METHOD FOR PRODUCTION THEREOF

The present invention relates to an electromechanical actuator, comprising a stack arrangement made of ceramic basis material having electromechanical properties and electrodes as well as ceramic insulation for use of the actuator in a humid environment. Such an actuator is also referred to as a multi-layer actuator or linear actuator. A further aspect of the invention relates to a method for the production of an actuator having ceramic insulation and a method for controlling such an actuator.

The service life of electromechanical actuators is limited, inter alia, when used in static or quasi-static applications due to the degradation mechanism via air humidity. In particular, diffusion or penetration of water vapor molecules into the stack arrangement causes a partial or total loss of function of the actuator, since this leads to a deterioration in the electrical and elastic behavior of the actuator. An increased service life can be obtained by insulation of the actuator, in particular having or being made of ceramic material. Such an electromechanical or piezoelectric actuator with ceramic insulation is known from DE 100 21 919 C2. Compared to actuators with polymer insulation, ceramic-insulated actuators when controlled with direct voltage (DC) can have a service life (mean time to failure MTTF) that is two to three orders of magnitude higher.

A piezoelectric actuator is also known from EP 2 530 756 A1 and is provided on its side surfaces with an inorganic layer, for example, made of lead-zirconate-titanate (PZT). U.S. Pat. No. 7,065,846 B2 also discloses a piezoceramic actuator having ceramic insulation.

Ceramic insulation of this type, however, has physical constraints. Ceramic-coated actuators have hitherto typically shown an electrically induced piezoelectric expansion of approx. 1.0‰ to 1.1‰ of the active length of the actuator when controlled with an electric field strength of 2 kV-DC/mm. An increase in the electrically induced piezoelectric expansion to, for example, >1.25‰ of the active length, as is possible, for example, by optimizing the electromechanical material system lead-zirconate-titanate (PZT), leads to the uncontrolled formation and growth of cracks in the ceramic insulation, which adversely affects the service life of the actuator. Due to the design of linear actuators, the electrodes do not extend into the insulation, as precisely the electrodes are to be protected from humidity. Consequently, the ceramic insulation can possibly only be excited by electrical stray fields, which naturally results in a lower or even no piezoelectrically induced expansion of the ceramic insulation. For this reason, a mechanical tensile stress arises during the actuation or expansion, respectively, of the actuator which leads to the formation of cracks due to continuous or alternating loads and can result in failure or loss of function of the actuator or reduce its service life in a humid environment.

WO 2017/032868 A1 discloses a piezoelectric multi-layer actuator with a protective layer produced on the actuator surface by air flow deposition (see page 4, lines 14-16) and made of ceramic particles that have been broken up and, for example, are connected to one another by annealing (see page 4, line 28-page 5, line 2).

This protective layer is to be very dense and free from pores and not to contain any "grain boundaries" such as those created by sintering processes, so that the protective layer supposedly remains free of cracks during operation even if the actuator has a small thickness (see page 5, lines 5-10). EP 2 667 425 B1 discloses a piezoelectric element with an inorganic coating in which metal particles are dispersed. Due to the metal particles, there is a risk of conductive paths in the coating that can form in particular at defects, which can lead to an acceleration of the failure mechanisms. The present invention is based on the object of providing an electromechanical actuator which has an extended service life, even with an increase in the electromechanical expansion, in that the formation of cracks in a sintered ceramic insulation is prevented.

The object of the invention is satisfied by the electromechanical actuator as well as a method for the production of an electromechanical actuator and a method for controlling an electromechanical actuator disclosed herein.

The electromechanical actuator according to the invention comprises a stack arrangement made of ceramic basis material having electromechanical properties and electrodes as well as ceramic insulation for use of the actuator in a humid environment, where the structure of the ceramic insulation has a smaller average grain size than the structure of the ceramic basis material. The specific selection of a ceramic insulation, the structure of which has a smaller average grain size than the structure of the ceramic basis material, increases the strength (yield strength, see Hall-Petch relationship) of the ceramic insulation and its resistance to forming cracks. By increasing this resistance, an extended service life of the actuator can be obtained even with a higher electromechanical expansion, which can be achieved due to the larger average grain size in the structure of the ceramic basis material because the usable electrically induced expansion of the material increases with increasing grain size. The ceramic basis material is preferably a piezoceramic basis material. The electromechanical properties of the actuator are preferably altered or set e.g. by polarization after the shaping of the ceramic basis material.

It can be advantageous to have the ratio of the average grain sizes of insulation to ceramic basis material be ¾ or less, preferably ½ or less, particularly preferably ⅓ or less. The smaller the average grain size of the insulation, the higher basically the strength and resistance of the insulation to the growth of cracks. The ratios mentioned achieve advantageous results, taking into account the mechanical interactions between the basis material and the insulation.

It can further be useful to have the average grain size of the insulation be 20 µm or less, preferably 5 µm or less, particularly preferably 1 µm or less.

In addition, it can prove to be practical to have the average grain size of the ceramic basis material decrease preferably continuously towards the insulation, preferably beyond the insulation. With a continuous decrease in the average grain size in the region in which the insulation adjoins the ceramic basis material, an expansion or tension crack in this region can be avoided.

It can prove useful to have the insulation be made of electromechanical, preferably piezoelectric and particularly preferably piezoceramic material.

In addition, it can be advantageous to have the insulation be impermeable to water vapor/moisture. This prevents water vapor molecules from diffusing or penetrating into the stack arrangement.

It can be useful to have the insulation be made of at least one layer, preferably of two or three layers, where the total thickness of the insulation is 500 µm or less, preferably 100 µm or less, particularly preferably 60 µm or less. By providing several layers, manufacturing defects such as holes or pores in individual layers can be covered by the other layers, which leads to an improvement in the insulation. The likelihood of end-to-end defects through the entire thickness of the insulation is then reduced with each additional layer.

Furthermore, it can be advantageous to have the insulation comprise substantially the same or a different material composition as/than the ceramic basis material.

In addition, it can be useful to have two exterior electrodes be provided for contacting the electrodes in the stack arrangement and be arranged on the same outer surface or on two different outer surfaces of the actuator, where at least one electrode-free outer surface of the actuator comprises the ceramic insulation. The actuator can be reliably insulated by attaching the external electrodes and providing the ceramic insulation on the electrode-free outer surfaces.

It can be useful to have the ceramic basis material and the electrodes be arranged along a stack axis and the stack arrangement to have two end faces aligned perpendicular to the stack axis and at least one side surface extending between the end faces, where the ceramic insulation on the at least one side surface extends from one end face to the other end face. Providing the ceramic insulation on these side surfaces prevents the diffusion or penetration of water vapor molecules between the electrodes and the ceramic basis material.

Another aspect of the invention relates to a method for the production of an electromechanical actuator, in particular an actuator according to one of the preceding configurations, comprising the steps of:

A: forming a stack arrangement from electrodes and from a ceramic basis material having electromechanical properties, B: providing the stack arrangement with ceramic insulation such that the structure of the insulation has a smaller average grain size than the structure of the ceramic basis material.

It can furthermore be useful to have the method comprise at least one of the following partial steps:

A1: forming the stack arrangement from the electrodes and from green tapes made of the ceramic basis material, A2: sintering the stack arrangement so that the ceramic basis material is transformed into a solid ceramic structure.

However, it can also be useful to have the method comprise at least one of the following partial steps:

B1: applying at least one, several, or all layers of the insulation onto the stack arrangement by coating, preferably with a green tape, injection molding, plasma spraying, immersion coating, preferably in ceramic slurry, spraying and/or by way of a sol-gel method, B2: sintering the ceramic insulation and possibly the ceramic basis material so that the ceramic insulation and possibly the ceramic basis material is/are transformed into a solid ceramic structure, B3: setting the average grain size of the insulation and possibly the average grain size of the ceramic basis material by selecting different materials for the ceramic basis material and the ceramic insulation and/or by selecting the process parameters during sintering.

It can also be useful to have the method comprise the following step:

C: polarizing the ceramic basis material and preferably the ceramic insulation to set the electromechanical properties of the actuator.

It can be useful to have the stack arrangement in step A be formed from electrodes and ceramic basis material along a stack axis so that the stack arrangement comprises two end faces oriented perpendicular to the stack axis and at least one side surface extending between the end faces, and the stack arrangement in step B be provided with the ceramic insulation such that the latter extends on the at least one side surface from one end face to the other end face As already mentioned above, providing the ceramic insulation on these side surfaces prevents the diffusion or penetration of water vapor molecules between the electrodes and the ceramic basis material.

Another aspect of the invention relates to a method for controlling an electromechanical actuator, in particular an actuator according to one of the preceding configurations, with an electrical field strength of at least 2 kV-DC/mm at room temperature and preferably at least 80%, preferably at least 85%, preferably at least 90% and particularly preferably at least 92% humidity, so that a quasi-static expansion of 1.25‰ or more of the active length of the actuator and a mean service life (MTTF) of the actuator of 10,000 hours or more is achieved.

An additional aspect of the invention relates to a method for controlling an electromechanical actuator, in particular an actuator according to one of the preceding configurations, with an electrical field strength of at least 2 kV-DC/mm at 90° C. and preferably at least 80%, preferably at least 85%, preferably at least 90% and particularly preferably at least 92% humidity, so that a quasi-static expansion of 1.25‰ or more of the active length of the actuator and a mean service life (MTTF) of the actuator of 500 hours or more is achieved.

Terms and Definitions

Green Tape Made of Ceramic Material

A flexible tape which is produced from ceramic slurry by a tape casting process is referred to as a green tape made of ceramic material.

Insulation

Insulation is a protective layer that prevents moisture from penetrating into the stack actuator.

Actuator

The term actuator is used synonymously for a stack actuator, multi-layer actuator, or linear actuator.

Ceramic Basis Material Having Electromechanical Properties

A ceramic basis material having electromechanical properties is a material that creates mechanical (elastic) deformation when an electrical voltage is applied. The starting point for this material can be ceramic powder which is sintered for shaping. The microstructure of the sintered ceramic is a polycrystalline material, the crystallites of which have domains with dipoles, the orientation of which is statistically distributed throughout the material. To set the electromechanical properties of the actuator, the dipoles are rectified, preferably by polarization.

Polarization

For the production of most electromechanical actuators, the material is polarized after sintering by applying an external unidirectional field, meaning that the dipoles are overall rectified. The polarization thus enables the desired electromechanical properties of the actuator to be set.

BRIEF DESCRIPTION OF THE FIGURES

FIG. 1 shows a top view of the actuator according to the invention as well as sections along the lines A-A and B-B.

DETAILED DESCRIPTION OF THE PREFERRED EMBODIMENTS

FIG. 1 shows an electromechanical actuator consisting of a rod-shaped stack arrangement 1 made of ceramic basis material having electromechanical properties and electrodes 2 which are alternately led on opposite side surfaces of the actuator. An exterior electrode 3 for contacting electrodes 2 is applied to each of these two side surfaces. External electrodes 3 are each connected to a connecting lead 4. The side surfaces of the actuator that are not covered by the external electrodes are provided with ceramic insulation 5.

The basic structure of this stack arrangement is known from DE 100 21 919 C2 and is not explained in more detail at this point. Instead, the differences according to the invention from the known stack arrangement, which shall be explained hereafter, shall be discussed primarily.

According to the invention, the structure of ceramic insulation 5 has a smaller average grain size than the structure of the ceramic basis material. Due to the small average grain size, a small pore size or porosity arises in the structure of ceramic insulation 5, as a result of which the defect size in the structure decreases and counteracts the formation or growth of cracks.

The ceramic basis material and the electrodes are preferably arranged along a stack axis, where the stack arrangement composed of ceramic basis material and electrodes has two end faces aligned perpendicular to the stack axis and at least one side surface extending between the end faces, and the ceramic insulation on the at least one side surface extends from one end face to the other end face. Without the ceramic insulation, the electrodes would be exposed on the circumferential side surfaces. Providing the ceramic insulation on these side surfaces prevents the diffusion or penetration of water vapor molecules between the electrodes and the ceramic basis material.

In a preferred embodiment, the ratio of the average grain sizes of insulation to ceramic basis material is ¾ or less, preferably ½ or less, particularly preferably ⅓ or less. Where the average grain size of the insulation can be 20 µm or less, preferably 5 µm or less, particularly preferably 1 µm or less.

The ceramic basis material is preferably piezoceramic material, such as e.g. lead zirconate titanate (PZT). In addition, however, it can also be electrostrictive or magnetostrictive material. Ceramic insulation 5 is likewise made of PZT or oxide ceramic material and preferably likewise has piezoelectric properties.

Ceramic insulation 5 can be composed of a single layer. In a preferred embodiment, however, ceramic insulation 5 has several layers, in particular two or three, in order to cover defects caused by manufacturing technology in one single layer with another layer. This can prevent the growth of cracks at the boundary between two insulation layers. As a result, ceramic insulation 5 can be made to be reliably impermeable to the penetration or diffusion of water vapor molecules into the stack arrangement. The individual layers can differ from one another in their composition or in their average grain size. The thickness of an individual layer is a multiple, preferably five to twenty times, the average grain size in this layer. In general, a small overall thickness of the ceramic insulation is to be aimed for, since the expansion of the ceramic basis material is less restricted by a thin insulation. In a preferred embodiment, the overall thickness of the insulation is 500 µm or less, preferably 100 µm or less, particularly preferably 60 µm or less.

A method according to the invention for the production of an actuator, preferably an actuator according to the above embodiments, shall be described hereafter.

The production of a stack arrangement from a ceramic basis material having electromechanical properties and electrodes is known in principle from DE 100 21 919 C2, but shall be outlined again briefly to improve the understanding of the method according to the invention.

The starting point for the production of stack arrangement 1 is ceramic powder material, preferably PZT powder material which is provided with a binder solution and a solvent. In the further course of the method, the ceramic slurry made of powder material and binder solution is poured to form so-called green tapes made of ceramic basis material, and the solvent evaporates. The flexible green tapes are then cut to size and stacked, where an electrode 2 is inserted between each two layers of a predefined number of green tapes. For this purpose, a metal paste is printed onto the respective green tape using a screen-printing method. Stack arrangement 1 produced in this manner is then isostatically pressed.

The method according to the invention now provides for such a stack arrangement 1 to be provided with ceramic insulation 5 so that the structure of ceramic insulation 5 has a smaller average grain size than the structure of the ceramic basis material. For this purpose, one or more green tapes with different material composition or with different material properties than the green tapes of the ceramic basis material are applied in a preferred embodiment to at least one side surface of stack arrangement 1. Stack arrangement 1 and ceramic insulation 5 are subsequently jointly sintered, as a result of which the green tapes of the ceramic basis material and ceramic insulation 5 are transformed into a solid ceramic structure. By selectively setting the compositions and/or the properties of the starting materials of the ceramic basis material and ceramic insulation 5, a smaller average grain size can be obtained in the solid structure of ceramic insulation 5 than in the structure of the ceramic basis material. After sintering, external electrodes 3 are applied to the side surfaces of the actuator and are configured to establish electrical contact with electrodes 2 in stack arrangement 1 and have no ceramic insulation 5. After the external electrodes have been applied, a unidirectional electric field is applied to create a polarization for polarizing the ceramic basis material and preferably ceramic insulation 5.

The method described above is a single-stage process since stack arrangement 1 and ceramic insulation 5 are sintered together. In addition, it is also possible to carry out a two-stage process in which stack arrangement 1 is first sintered, then one or more layers of ceramic insulation 5 is/are applied onto sintered stack arrangement 1, and the stack arrangement provided with ceramic insulation 5 is sintered again. The different average grain sizes in the structure of ceramic insulation 5 and the ceramic basis material can there be set in particular by the selective selection of the process parameters in the individual sintering stages, where the composition or properties of the starting materials of the ceramic basis material and ceramic insulation 5 can be substantially the same.

According to the above embodiments, the average grain sizes in the respective microstructure in the single-stage process is set substantially by way of the different compositions or properties of the starting materials of the ceramic basis material and ceramic insulation 5, in the two-stage process, however, substantially by the selection of the process parameters in the individual sintering processes. However, the method according to the invention is not restricted to such a single-stage or multi-stage method.

In addition, the desired average grain size in the respective microstructure can also be set in the single-stage process by the suitable selection of the process parameters. Microwave sintering, which shall be described in more detail hereafter, results in non-uniform heat distribution in the stack arrangement in which lower temperatures arise in the edge regions of the insulation due to the energy radiated via the surface of the stack arrangement, so that the grain growth at the center is greater than in the insulation.

Non-uniform temperature distribution in the stack arrangement during the sintering process is also possible by applying a suitable electrical voltage to the actuators since the resulting current flow causes heating, and, due to of the energy irradiation at the surface of the stack arrangement, it has a lower temperature than its core region. The electrical field in the interior of the stack arrangement resulting from the electrical voltage can additionally have a positive influence on grain growth or the grain size distribution in the stack and the insulation.

In addition, the grain growth can also be influenced by an external electric field in the above-mentioned sense (gradual progression of the grain size in the ceramic insulation) without there being any conductive contact to the actuators.

Furthermore, different material compositions or material properties can also be used in the two-stage process in addition to different process parameters in the individual sintering processes.

Some examples for the realization of different compositions or properties of the starting materials which can contribute to setting different average grain sizes in the respective structures shall be explained hereafter.

Firstly, it is advisable to use a starting material for the ceramic basis material, the average grain size of which with typical sintering is sufficiently large to achieve expansions >1.1‰. For ceramic insulation 5, this material can be doped with a grain growth inhibitor in order to inhibit the grain growth in the structure of ceramic insulation 5 as compared to the grain growth in the structure of the ceramic basis material in a subsequent sintering process.

Secondly, a starting material can be used for ceramic insulation 5, the average grain size of which, with typical sintering, is sufficiently small to meet the strength requirements for the insulation. For the ceramic basis material, this material can be doped with a grain growth accelerator in order to accelerate the grain growth in the structure of ceramic basis material as compared to the grain growth in the structure of ceramic insulation 5 in a subsequent sintering process.

Furthermore, the starting materials of the ceramic basis material and ceramic insulation 5 can differ in their initial grain size. This means that a particularly finely ground powder can be used for ceramic insulation 5 as compared to the ceramic basis material, which leads to a smaller average grain size in the structure of ceramic insulation 5 even after sintering.

In addition, especially in the case of PZT materials, there is the possibility of selecting starting materials for the ceramic basis material and ceramic insulation 5 that differ in their affinity for lead. If a starting material with a higher affinity for lead than the starting material for ceramic insulation 5 is selected for the ceramic basis material, then the ceramic basis material removes part of the lead that is contained from the ceramic insulation. This removal slows the grain growth dynamics in ceramic insulation 5.

In order to set the desired difference in the average grain sizes in the respective microstructures, the above-mentioned options for realizing different material compositions or material properties, respectively, can be used individually or in combination.

The temperature or the temperature profile over time, the holding time, electrical fields in the environment, and the ambient atmosphere, in particular the oxygen content and the atmospheric pressure, substantially describe the process parameters that can be set for the respective sintering processes which individually or in combination can contribute to realizing different average grain sizes in the respective microstructure.

In addition, the difference in the average grain size in the respective structures can also be obtained through the use of microwave sintering. Due to the dipole structure of piezo-ceramics, the heat develops in the volume of the component during microwave sintering. Since heat is dissipated from the surface of the component to the colder environment, i.e. the atmosphere and walls of the sintering assembly, the sintering temperature of the surface and therefore of ceramic insulation 5 is below the core temperature of the ceramic basis material. As a result of this temperature difference, the grain growth in ceramic insulation 5 proceeds more slowly.

The present method is not restricted to the application of layers of ceramic insulation 5 in the form of a green tape. There are also the possibilities of applying the starting material of ceramic insulation 5 by injection molding, plasma spraying, immersion coating in ceramic slurry, spraying or in by way of a sol-gel method. With the exception of plasma spraying, all of the above-mentioned methods of layer application can be used for both a single-stage as well as a two-stage sintering process, as described above. Plasma-sprayed layers do not have to be sintered again, but can already have their desired properties after the layer has been applied. Subsequent temperature treatment, however, can be advantageous.

Each of the above-mentioned methods of layer application can be combined with the options already mentioned for the different material compositions or material properties and the process parameters during sintering. Furthermore, one or more layers of ceramic insulation 5 can be realized with all of the methods mentioned.

A grain size gradient can be set via the ceramic insulation 5 by selecting different material compositions or material properties in each layer of ceramic insulation 5 or by individually sintering each of these layers. Furthermore, as a result of interaction, in particular diffusion, at the layer boundaries of layers with different material compositions or material properties, a grain size gradient arises at these layer boundaries. With such a grain size gradient, expansion or tension cracks are prevented.

Already polarized actuators according to the invention were subjected to a static life test at a constant voltage (DC). At the same time, prior art actuators with ceramic insulation were investigated. The control voltage was selected such that the actuators showed an expansion of the active region of 1.47‰. The mean service life MTTF of the actuators was determined based on the times to failure of the actuators for each test group. The values determined and the test conditions can be gathered from Table 1.

The MTTF for polymer-coated actuators was calculated using the service life formula of the respective manufacturer.

The MTTF of the actuators according to the invention at 25° C. and 30% relative humidity was determined by extrapolation based on a series of tests.

TABLE 1

| type of actuator | test conditions | mean service life MTTF |
|---|---|---|
| polymer-coated multi-layer actuators | 1.47‰ expansion, 80° C., 80% relative humidity, DC | 44 h |
| ceramic insulated multi-layer actuators having the same average grain size in the insulation as in the basis material | 1.47‰ expansion, 80° C., 80% relative humidity, DC | 1360 h |
| ceramic insulated multi-layer actuators having a smaller average grain size in the insulation than in the basis material (according to the invention) | 1.47‰ expansion, 80° C., 80% relative humidity, DC | 2460 h |
| ceramic insulated multi-layer actuators having a smaller average grain size in the insulation than in the basis material (according to the invention) | 1.47‰ expansion, 25° C., 30% relative humidity, DC | >500000 h |

LIST OF REFERENCE CHARACTERS

1 stack arrangement
2 electrodes
3 external electrode
4 connecting lead
5 ceramic insulation

The invention claimed is:

1. Electromechanical actuator comprising:
a stack arrangement made of ceramic basis material having electromechanical properties;
electrodes; and
a ceramic insulation configured for operation of said actuator in a humid environment, wherein a structure of said ceramic insulation has a smaller average grain size than a structure of said ceramic basis material;
where said ceramic basis material and said electrodes are arranged along a stack axis and said stack arrangement comprises:
two end faces aligned perpendicular to said stack axis and at least one side surface extending between said end faces, where said ceramic insulation on said at least one side surface extends from one end face to the other end face.

2. Actuator according to claim 1, wherein a ratio of average grain size of the ceramic insulation structure to that of the ceramic basis material is selected to be one or more of ¾ or less, ½ or less, and/or ⅓ or less.

3. Actuator according to claim 1, wherein an average grain size of said ceramic insulation structure is selected to be one or more of 20 μm or less, 5 μm or less, and/or 1 μm or less.

4. Actuator according to claim 1, wherein an average grain size of the ceramic basis material decreases continuously towards said ceramic insulation, and/or beyond said ceramic insulation.

5. Actuator according to claim 1, wherein said ceramic insulation is made of at least one or more of electromechanical, piezoelectric, and/or piezoceramic, material.

6. Actuator according to claim 1, wherein said ceramic insulation is impermeable to water vapor/moisture.

7. Actuator according to claim 1, wherein said ceramic insulation is made of at least one or more layers, where a total thickness of said ceramic insulation is at least one or more of 500 μm or less, 100 μm or less, and/or 60 μm or less.

8. Actuator according to claim 1, wherein said ceramic insulation has substantially a same or a different material composition as/than said ceramic basis material.

9. Actuator according to claim 1, comprising:
two exterior electrodes for contacting said electrodes in said stack arrangement, arranged on a same outer surface or on two different outer surfaces of said actuator, where at least one electrode-free outer surface of said actuator includes said ceramic insulation.

10. Actuator according to claim 2, wherein an average grain size of said ceramic insulation structure is selected to be one or more of 20 μm or less, 5 μm or less, and/or 1 μm or less.

11. Actuator according to claim 10, wherein an average grain size of the ceramic basis material decreases continuously towards said ceramic insulation, and/or beyond said ceramic insulation.

* * * * *